United States Patent
Jiao et al.

(10) Patent No.: US 7,289,945 B2
(45) Date of Patent: Oct. 30, 2007

(54) ANALYZING INTERCONNECT STRUCTURES

(75) Inventors: Dan Jiao, Santa Clara, CA (US); Mohiuddin Mazumder, San Jose, CA (US); Changhong Dai, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 692 days.

(21) Appl. No.: 10/281,857

(22) Filed: Oct. 28, 2002

(65) Prior Publication Data

US 2004/0082230 A1    Apr. 29, 2004

(51) Int. Cl.
G06F 17/50    (2006.01)
(52) U.S. Cl. .................................................. 703/14
(58) Field of Classification Search .................. 703/14
See application file for complete search history.

(56) References Cited

U.S. PATENT DOCUMENTS

| | | | | |
|---|---|---|---|---|
| 6,002,988 | A * | 12/1999 | Whaley et al. | 702/57 |
| 6,057,171 | A * | 5/2000 | Chou et al. | 438/15 |
| 6,088,523 | A * | 7/2000 | Nabors et al. | 703/14 |
| 6,167,364 | A * | 12/2000 | Stellenberg et al. | 703/19 |
| 6,289,298 | B1 * | 9/2001 | Belk | 703/5 |
| 6,295,635 | B1 * | 9/2001 | Dhaene et al. | 716/14 |
| 6,312,963 | B1 * | 11/2001 | Chou et al. | 438/18 |
| 6,330,704 | B1 * | 12/2001 | Ljung et al. | 716/5 |
| 6,453,444 | B1 * | 9/2002 | Shepard | 716/2 |
| 6,567,960 | B2 * | 5/2003 | Chang et al. | 716/5 |
| 6,643,831 | B2 * | 11/2003 | Chang et al. | 716/4 |
| 6,762,726 | B2 * | 7/2004 | Alden et al. | 343/703 |
| 6,909,127 | B2 * | 6/2005 | O'Mahony et al. | 257/208 |
| 2003/0069722 | A1 * | 4/2003 | Beattie et al. | 703/14 |
| 2004/0078407 | A1 * | 4/2004 | Naslund et al. | 708/492 |
| 2005/0240883 | A1 * | 10/2005 | Huang et al. | 716/1 |

OTHER PUBLICATIONS

Eli Chipout (IEEE 1998) teaches an "Interconnect and Substrat Modeling and Analysis", p. 1441-1452.*
Restle et al. (IEEE 2001) teaches a full-wave PEEC time-domain method for the modeling of on-chip interconnects (p. 877-887).*
Heeb et al., teaches a three-dimensional interconnect analysis using partial element equivalent circuit (IEEE 1992), pp. 974-982).*
Feldmann et al., teaches an efficient techniques for modeling chip-level interconnect, substrate and packaging parasitics (ACM 1999), pp. 1-5).*

* cited by examiner

*Primary Examiner*—Paul Rodriguez
*Assistant Examiner*—Andre Pierre-louis
(74) *Attorney, Agent, or Firm*—Trop, Pruner & Hu, P.C.

(57) ABSTRACT

In one embodiment, an interconnect structure may be analyzed to determine electromagnetic characteristics of the structure by identifying structure seeds corresponding to the structure; modeling the structure seeds to obtain field patterns; and processing the field patterns to obtain the electromagnetic characteristics.

2 Claims, 4 Drawing Sheets

ANALYZING INTERCONNECT STRUCTURES

BACKGROUND

The invention relates to analyzing interconnect structures and more specifically to analyzing such structures using modeling techniques.

Interconnect structures (also termed "interconnects") are used to connect circuitry and may be located either on or off of a semiconductor device or chip. The accurate analysis of such structures is of great importance to high speed chip design since the performance of interconnects has impact on signal delay, signal decay, cross talk, and power delivery. Such analysis becomes more important as the clock frequency of microprocessors increases, heading to the 20 gigahertz (GHz) level in the 0.13 micron (μm) processing generation and beyond. However, the computational complexity of interconnects especially on-chip interconnects resulting from high conductor loss, strong skin effect, non-uniform dielectric, orthogonal layers, and large aspect ratio prevents an efficient and rigorous analysis of large-scale three-dimensional (3D) interconnects.

Two modeling methodologies for 3D on-chip interconnects have been adopted. One manner of analyzing interconnect structures, particularly 3-dimensional (3D) structures, is by extracting resistance (R), inductance (L), and capacitance (C) using computer aided design (CAD) tools and inputting the results into a circuit simulator. However, this approach is based on low frequency approximation, the validity of which is questionable at high frequencies. Another manner of analyzing an interconnect is to partition it into subcircuits and input the parts into a full-wave solver and cascade each subcircuit to extract the overall circuit behavior. However, this approach cannot model electromagnetic coupling correctly. To correctly do so, the entire 3D structure must be simulated instead of partitioning it first. However, a 3D interconnect structure can involve billions of unknowns, which no current computational resources can tolerate.

Thus a need exists to accurate and efficiently analyze interconnect structures, such as large scale 3D structures.

DETAILED DESCRIPTION

In one embodiment of the present invention, an interconnect structure, such as a large scale, on-chip, 3D structure, is analyzed via full-wave modeling. Such analyzing may obtain the electromagnetic fields within the structure and extract circuit parameters therefrom.

Figure 1:
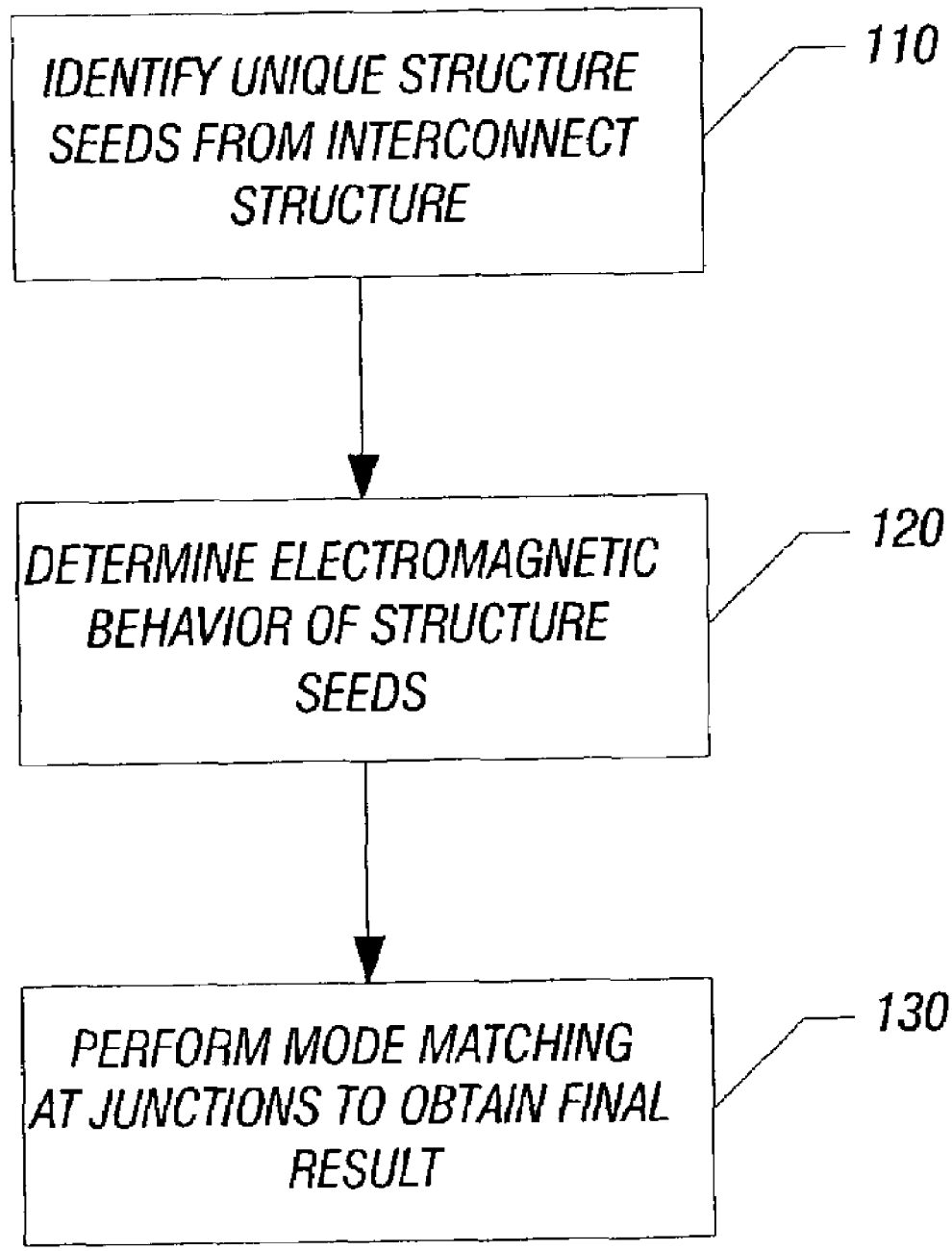
FIG. 1 is a flow diagram of a method in accordance with one embodiment of the present invention.

Such analysis of an interconnect structure may be performed in accordance with the flow diagram set forth as FIG. 1, which is a flow diagram of an example module for analysis of an interconnect structure according to one embodiment of the present invention.

Referring now to FIG. 1, in one embodiment using full-wave modeling, an interconnect structure may be sliced into segments. Each segment has a constant cross section. A plurality of unique structure seeds may be identified from the interconnect structure undergoing analysis (block 110). As used herein, the term "structure seed" means a two-dimensional slice representing a unique three-dimensional geometric pattern of a segment of the interconnect structure. The number of unique structure seeds needed to represent an entire interconnect structure is dependent on the number of different geometric patterns of the interconnect, as will be discussed in more detail below. Note that although the number of segments can be very large, the number of structure seeds is typically only a few.

In one embodiment, electromagnetic behavior of each of the structure seeds next may be determined, for example, using a full wave electromagnetic solver (block 120). Then mode matching may be performed at the junctions of the structure seeds to yield a final result corresponding to the electromagnetic characteristics of the interconnect structure (block 130).

Figure 2A:
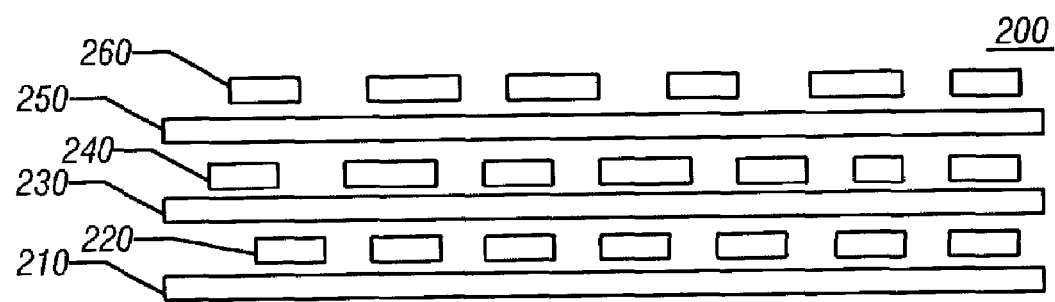
FIG. 2A is a transverse cross section view of an example interconnect structure.
Figure 2C:
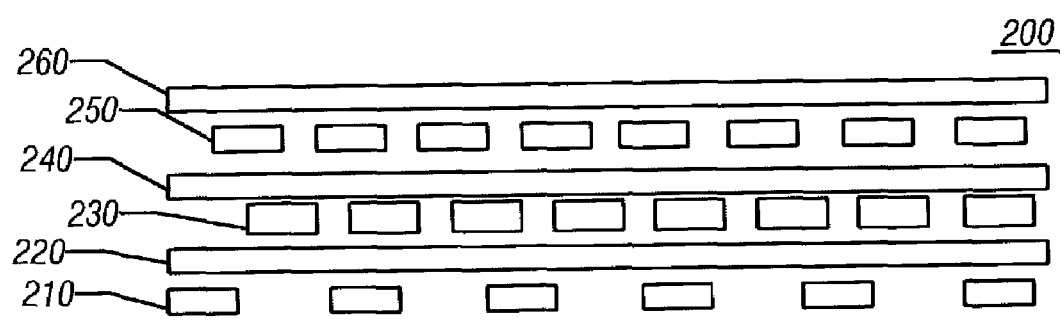
FIG. 2C is a partial side cross section view of the example interconnect structure.
Figure 2B:
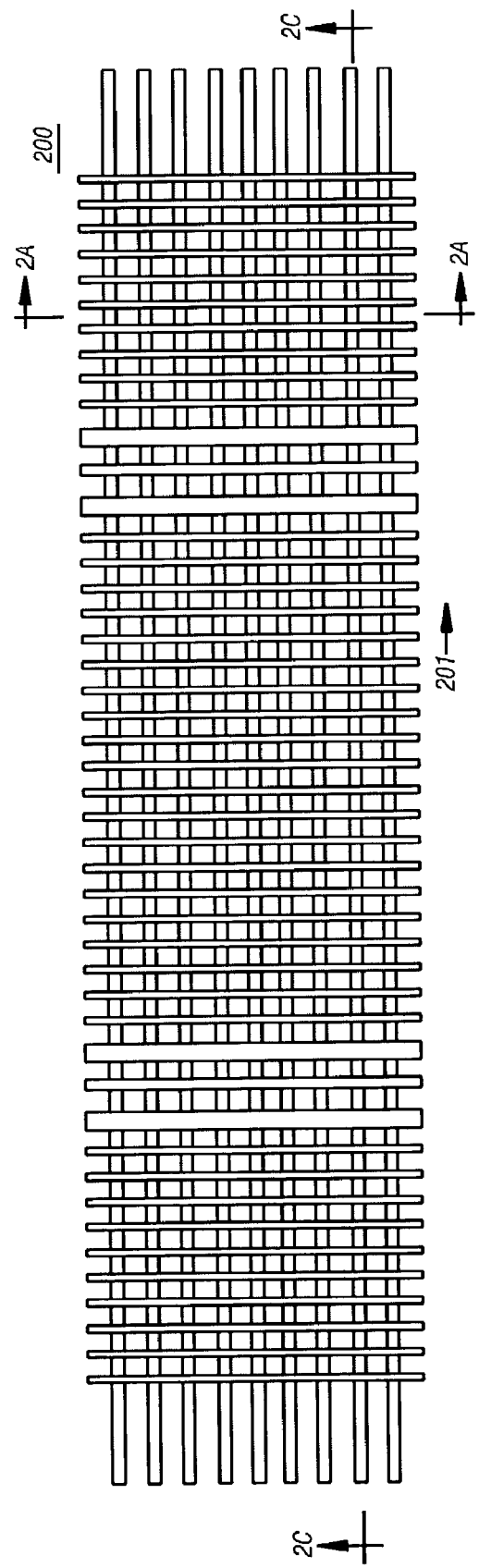
FIG. 2B is a top view of the example interconnect structure.

Referring now to FIG. 2A, shown is a transverse cross-section view of an example interconnect structure 200, while FIGS. 2B and 2C show, respectively, a top view and a partial side cross-section view of interconnect structure 200. Arrow 201 in FIG. 2B indicates the longitudinal direction of propagation through the interconnect structure 200. Interconnect structure 200 includes six layers, namely first layer 210, second layer 220, third layer 230, fourth layer 240, fifth layer 250, and sixth layer 260. These layers may correspond to the six metal layers found in many semiconductor devices.

In this interconnect structure 200, signal lines are embedded in the fourth layer 240 and the sixth layer 260. Parallel returns lie in the second layer 220, and orthogonal returns reside in the first layer 210, third layer 230, and fifth layer 250. The orthogonal returns in the different metal layers may be aligned or unaligned along the longitudinal direction. The parallel returns may be randomly distributed in the transverse cross section.

In other embodiments, the lines of each of the layers may be signal lines or return lines, and may be oriented in any desired manner. While shown having six layers, it is to be understood that interconnect structure 200 may have more or fewer layers and/or lines in other embodiments.

As discussed above, in one embodiment a set of unique structure seeds may be identified. For interconnect structure 200, there may be at most eight unique structure seeds, reflecting that the total number of orthogonal layers is three. In one embodiment, a three digit binary number may be used to describe the eight structure seeds, i.e, 000, 001, 010, . . . , 110, and 111. In this three digit number, the first digit corresponds to the fifth layer 250, the second digit corresponds to the third layer 230, and the third digit corresponds to the first layer 210. The reason for selecting these layers (and a three digit binary number) to describe the structure seeds is that the other layers (i.e., second layer 220, fourth layer 240, and sixth layer 260) have constant cross section throughout the structure.

In one embodiment, for each digit of the binary number, a zero value may denote the absence of orthogonal returns in that layer, whereas a one value may denote the presence of such returns. If the orthogonal returns are aligned in each layer (i.e., vertically aligned), the total number of structure seeds needed to describe interconnect structure 200 is two.

The first structure seed refers to the presence of all of the orthogonal returns, while the second denotes their absence. The structure seeds may be periodically repeated along the longitudinal direction of the interconnect structure, thereby constructing the entire structure.

It is to be understood that in other embodiments, a different correspondence between layers and digits may exist, and further that the digit value may denote different meanings. More so, in other embodiments different schemes may be used to represent structure seeds.

After identification, the structure seeds may be used to further analyze the interconnect structure. In one embodiment, full-wave modeling may be performed on the structure seeds. While such full-wave modeling may be performed in various ways and using various tools, in one embodiment, the full-wave modeling may be performed by invoking an electromagnetic solver, such as a frequency domain eigenvalue solver. In one embodiment, the solver may be performed via a CAD tool. Such a solver represents the original wave propagation problem into a generalized eigenvalue problem. In one embodiment, the geometry and material description of the interconnect structure may be used in performance of the solver. In such an embodiment, the material description may include information regarding the dielectric and conductive properties of the interconnect structure.

In one embodiment, the solver may be arranged such that the eigenvalues may be the propagation constants of the modes that can be supported by the interconnect structure, and the eigenvectors may correspond to the transverse and longitudinal field distribution. That is, the eigenvectors may correspond to the field pattern in the structure seeds identified as discussed above.

By employing the analytical feature of waves propagating along the longitudinal direction in each segment, the solver may rigorously reduce the 3D discretization of the structure to two dimensions (2D), namely the transverse cross section of the structure. Such transverse cross section is shown, for example, in FIG. 2A. Despite a 2D discretization, both transverse and longitudinal fields within the structure are modeled. The propagation characteristics and field pattern for each structure seed are returned. The field pattern is a superposition of all of the forward and backward propagation modes for that structure seed. Left unknown by the solver is how to weight these modes. Thus the unknown coefficients of each mode remain to be determined.

In one embodiment, post processing of the field patterns of the structure seeds may next be performed to determine these coefficients and obtain the solution of the original 3D problems. In one embodiment, the post processing may be accomplished via mode matching. Such mode matching may be performed at the junctions of the structure seeds along the longitudinal direction. Mode matching essentially imposes the tangential continuity of the electric and magnetic fields at each junction.

In one embodiment, if an interconnect has n structure segments, and in each segment there are m modes, the number of unknown coefficients is 2×n×m. Mode matching yields 2m equations at each junction, thus giving a 2×n×m matrix system for the entire structure. The matrix is sparse, and has only 2×m nonzero elements in each row and can thus be efficiently solved. This procedure also applies to the situation in which each segment has a different number of modes.

The solution of the matrix returns information regarding the electromagnetic fields inside the interconnect structure under analysis. From this information, circuit parameters may be readily extracted. In one embodiment, the circuit parameters may be full-wave equivalent circuit parameters including resistivity (R), capacitance (C), inductance (L), and conductance (G) (collectively the full-wave RLGC). Additionally, scattering parameters (S-parameters), which are reflection and transmission coefficients between incident and reflection waves, may be obtained. In addition, field and current distribution of the interconnect may be obtained.

Thus according to one embodiment, full-wave modeling of 3D interconnects may be performed by identifying and obtaining solutions to a plurality of 2D problems. The solution of these 2D problems may then be post processed to obtain the solution of the original 3D problems. Despite the complexity of the 3D interconnect, the full-wave solution may be accomplished by only using 2D-like processor time and memory. In so doing, rigorous fast analysis of the interconnect structure may be accomplished without introducing any approximation.

While described above with regard to an on-chip interconnect structure, it is understood that embodiments of the present invention may be used to analyze off-chip structures, optical fibers, and other dielectric and metallic waveguides.

Embodiments may be implemented in a computer program, for example, a full-wave interconnect simulator implemented in a CAD tool. As such, these embodiments may be stored on a storage medium having stored thereon instructions which can be used to program a computer system to perform the embodiments. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs), erasable programmable read-only memories (EPROMs), electrically erasable programmable read-only memories (EEPROMs), magnetic or optical cards, or any type of media suitable for storing electronic instructions. Similarly, embodiments may be implemented as software modules executed by a programmable control device. A programmable control device may be a computer processor or a custom designed state machine. Custom designed state machines may be embodied in a hardware device such as a printed circuit board having discrete logic, integrated circuits, or specially designed application specific integrated circuits (ASICs).

Figure 3:
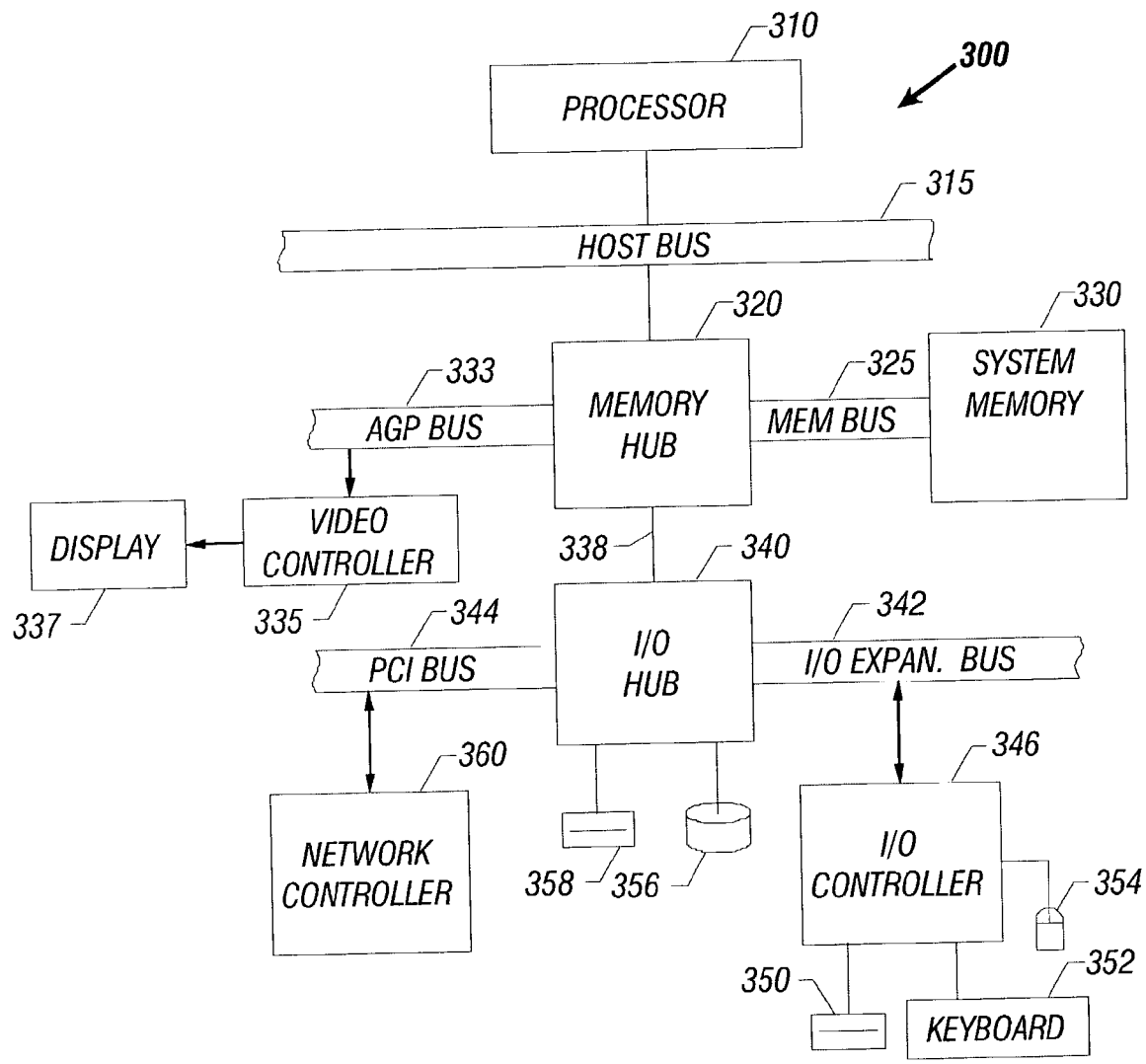
FIG. 3 is a block diagram of a system in accordance with one embodiment of the present invention.

Example embodiments may be implemented in software for execution by a suitable data processing system configured with a suitable combination of hardware devices. FIG. 3 is a block diagram of a representative data processing system, namely computer system 300 with which embodiments of the invention may be used.

Now referring to FIG. 3, in one embodiment, computer system 300 includes a processor 310, which may include a general-purpose or special-purpose processor such as a microprocessor, microcontroller, ASIC, a programmable gate array (PGA), and the like. As used herein, the term "computer system" may refer to any type of processor-based system, such as a desktop computer, a server computer, a laptop computer, an appliance or set-top box, or the like.

The processor 310 may be coupled over a host bus 315 to a memory hub 320 in one embodiment, which may be coupled to a system memory 330 via a memory bus 325. The memory hub 320 may also be coupled over an Advanced Graphics Port (AGP) bus 333 to a video controller 335, which may be coupled to a display 337. The AGP bus 333 may conform to the Accelerated Graphics Port Interface Specification, Revision 2.0, published May 4, 1998, by Intel Corporation, Santa Clara, Calif.

The memory hub 320 may also be coupled (via a hub link 338) to an input/output (I/O) hub 340 that is coupled to a input/output (I/O) expansion bus 342 and a Peripheral Component Interconnect (PCI) bus 344, as defined by the PCI Local Bus Specification, Production Version, Revision 2.1 dated in June 1995. The I/O expansion bus 342 may be coupled to an I/O controller 346 that controls access to one or more I/O devices. As shown in FIG. 3, these devices may include in one embodiment storage devices, such as a floppy disk drive 350 and input devices, such as keyboard 352 and mouse 354. The I/O hub 340 may also be coupled to, for example, a hard disk drive 356 and a compact disc (CD) drive 358, as shown in FIG. 3. It is to be understood that other storage media may also be included in the system.

In an alternate embodiment, the I/O controller 346 may be integrated into the I/O hub 340, as may other control functions. The PCI bus 344 may also be coupled to various components including, for example, a network controller 360 that is coupled to a network port (not shown).

Additional devices may be coupled to the I/O expansion bus 342 and the PCI bus 344, such as an input/output control circuit coupled to a parallel port, serial port, a non-volatile memory, and the like.

Although the description makes reference to specific components of the system 300, it is contemplated that numerous modifications and variations of the described and illustrated embodiments may be possible. For example, instead of memory and I/O hubs, a host bridge controller and system bridge controller may provide equivalent functions. In addition, any of a number of bus protocols may be implemented.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

identifying a first seed and a second seed each corresponding to a three dimensional interconnect structure having a plurality of layers, each seed including a unique two dimensional cross section of the three dimensional interconnect structure;

forming a first two dimensional model of the first seed in the frequency domain to obtain a first two dimensional electromagnetic field;

forming a second two dimensional model of the second seed in the frequency domain to obtain a second two dimensional electromagnetic field;

determining a first mode of operation and a second mode of operation for the first seed;

determining a third mode of operation and a fourth mode of operation for the second seed;

mode matching to obtain a first weighting coefficient for the first mode, a second weighting coefficient for the second mode, a third weighting coefficient for the third mode, and a fourth weighting coefficient for the fourth mode;

forming a three dimensional model based on the first two dimensional electromagnetic field, the second two dimensional electromagnetic field, the first weighting coefficient, the second weighting coefficient, the third weighting coefficient, and the fourth weighting coefficient.

2. The method of claim 1, wherein the first mode and the second mode are each forward propagation modes and the third mode and the fourth modes are each backward propagation modes.

* * * * *